(12) United States Patent
Daubenspeck et al.

(10) Patent No.: US 8,710,656 B2
(45) Date of Patent: Apr. 29, 2014

(54) REDISTRIBUTION LAYER (RDL) WITH VARIABLE OFFSET BUMPS

(75) Inventors: Timothy H. Daubenspeck, Colchester, VT (US); Brian M. Erwin, Lagrangeville, NY (US); Jeffrey P. Gambino, Westford, VT (US); Wolfgang Sauter, Hinesburg, VT (US); George J. Scott, Chandler, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/553,882

(22) Filed: Jul. 20, 2012

(65) Prior Publication Data

US 2014/0021600 A1    Jan. 23, 2014

(51) Int. Cl.
*H01L 23/48* (2006.01)
*H01L 21/44* (2006.01)

(52) U.S. Cl.
USPC ............... 257/737; 257/738; 257/E23.021; 257/E23.069; 438/612; 438/613; 438/614

(58) Field of Classification Search
USPC ............ 257/737, 738, E23.021, E23.069, 257/E23.068; 438/612–617
See application file for complete search history.

(56) References Cited

U.S. PATENT DOCUMENTS

| | | | |
|---|---|---|---|
| 6,011,314 A | 1/2000 | Leibovitz et al. | |
| 7,490,402 B2 | 2/2009 | Pai et al. | |
| 7,579,694 B2 | 8/2009 | Jan et al. | |
| 8,084,871 B2 | 12/2011 | Rahim et al. | |
| 8,093,718 B2 | 1/2012 | Chang | |
| 2006/0264021 A1* | 11/2006 | Farahani et al. | 438/612 |
| 2010/0213608 A1 | 8/2010 | Lau et al. | |
| 2011/0024900 A1 | 2/2011 | Walter et al. | |
| 2011/0291298 A1 | 12/2011 | Chumakov | |
| 2012/0001323 A1 | 1/2012 | Huisinga et al. | |

OTHER PUBLICATIONS

Yadav et al., "Reliability Evaluation on Low k Wafer Level Packages", 2011 Electronic Components and Technology Conference, IEEE, pp. 71-77.
US 7,989,961, 08/2011, Rahim et al. (withdrawn)

* cited by examiner

*Primary Examiner* — Jasmine Clark
(74) *Attorney, Agent, or Firm* — David A. Cain; Hoffman Warnick LLC

(57) ABSTRACT

An integrated circuit (IC) chip is disclosed including a plurality of metal vertical interconnect accesses (vias) in a back end of line (BEOL) layer, a redistribution layer (RDL) on the BEOL layer, the BEOL layer having a plurality of bond pads, each bond pad connected to at least one corresponding metal via through the RDL; and a solder bump connected to each bond pad, wherein each solder bump is laterally offset from the corresponding metal via connected to the bond pad towards a center of the IC chip by an offset distance, wherein the offset distance is non-uniform across the IC chip. In one embodiment, the offset distance for each solder bump is proportionate to a distance between the center of the IC chip and the center of the corresponding solder bump pad structure for that solder bump.

19 Claims, 16 Drawing Sheets

REDISTRIBUTION LAYER (RDL) WITH VARIABLE OFFSET BUMPS

TECHNICAL FIELD

The subject matter disclosed herein relates to methods and structures for forming solder bump pad structures on semiconductor chips. More specifically, aspects of the invention relate to a redistribution layer having variable, non-uniform, offset bumps.

BACKGROUND

In flip chip processing of integrated circuit (IC) chips, controlled collapse chip connection (C4) solder bumps are typically used to connect IC dies to packaging. However, due to the coefficient of thermal expansion (CTE) mismatch between different layers in the packaging, C4 solder bumps can experience large stresses which can lead to crack formation during chip joining. These CTE mismatches must be managed, especially in lead free (Pb-free) solder bumps, to control cracking during chip joining (referred to as "white bump formation").

Redistribution layers (RDL) are commonly used as top-level wiring on an integrated circuit (IC) for the purpose of redistributing chip-level I/O and power, and for customizing or adding/eliminating connections needed for particular chip-to-package product configurations.

RDL's are typically formed by adding a layer of insulating dielectric material onto a finished back-end-of-line (BEOL) structure at wafer level, and then forming the new level of redistribution wiring either in aluminum or copper metalization using standard BEOL processing. Once the metalized redistribution layer is patterned, this new RDL wiring level is coated with a layer of insulating organic dielectric material through which the interconnect openings for solder pad/bump connections are formed. In a particular type of RDL, the first insulating dielectric material in which the wiring is formed may be an organic polymer (e.g. BCB or PSPI).

As solder bump size decreases into the 75 micrometer range, effective current distribution becomes more important in order to meet C4 bump-level electromigration requirements, and the thick Cu structure provides a mechanism for achieving enhanced current distribution in the manner of a copper pillar or partial copper pillar structure.

BRIEF SUMMARY

Embodiments of the invention provide a semiconductor chip structure including a plurality of metal vertical interconnect accesses (vias) in a back end of line (BEOL) layer, a redistribution layer (RDL) on the BEOL layer, the BEOL layer having a plurality of bond pads, each bond pad connected to at least one corresponding metal via through the RDL, and a solder bump connected to each bond pad, wherein each solder bump is laterally offset from the corresponding metal via connected to the bond pad towards a center of the IC chip by an offset distance, wherein the offset distance is non-uniform across the IC chip. An offset distance for a particular C4 bump is based, in part, on that C4 bumps location on the chip. In one embodiment, solder bumps are offset laterally toward the center of the chip by an amount proportional to the distance between the center of the IC chip and the original topmost BEOL connection point, i.e., the center of the metal via connection under the bond pad that connects to the underlying layers. Therefore, bumps near the edge of a chip will be more laterally offset from their underlying metal via connections than bumps near the center of the chip. The distance a bump is offset is also limited by the overall bump pitch so that an adequate distance remains between adjacent bumps. A method for forming an RDL having variable offset bumps is also disclosed.

A first embodiment of the invention includes an integrated circuit (IC) chip comprising: a semiconductor substrate having a plurality of metal vertical interconnect accesses (vias) in a back end of line (BEOL) layer; a redistribution layer (RDL) on the BEOL layer, the BEOL layer having a plurality of bond pads, each bond pad connected to at least one corresponding metal via through the RDL; and a solder bump connected to each bond pad, wherein each solder bump is laterally offset from the corresponding metal via connected to the bond pad towards a center of the IC chip by an offset distance, wherein the offset distance is non-uniform across the IC chip.

A second embodiment of the invention includes an integrated circuit (IC) chip comprising: a semiconductor substrate having a plurality of metal vertical interconnect accesses (vias) in a back end of line (BEOL) layer; a redistribution layer (RDL) on the BEOL layer; a plurality of bond pads on the RDL, each bond pad connected to a corresponding metal via through the RDL; and a solder bump connected to each bond pad, wherein each solder bump is laterally offset from the corresponding metal via connected to the bond pad towards a center of the IC chip by an offset distance, wherein the offset distance for each solder bump is proportionate to a distance between the center of the IC chip and the center of the corresponding metal via for that solder bump.

A third embodiment of the invention includes a method for non-uniformly offsetting solder bumps on an integrated circuit (IC) chip, the method comprising: providing a semiconductor substrate having a plurality of metal vertical interconnect accesses (vias) in a back end of line (BEOL) layer; forming a redistribution layer (RDL) on the BEOL layer; forming a plurality of bond pads on the RDL, each bond pad connected to a corresponding metal via through the RDL; and positioning a solder bump on each solder bump pad structure such that each solder bump is laterally offset from the corresponding metal via connected to the bond pad towards a center of the IC chip by an offset distance, wherein the offset distance is non-uniform across the IC chip.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
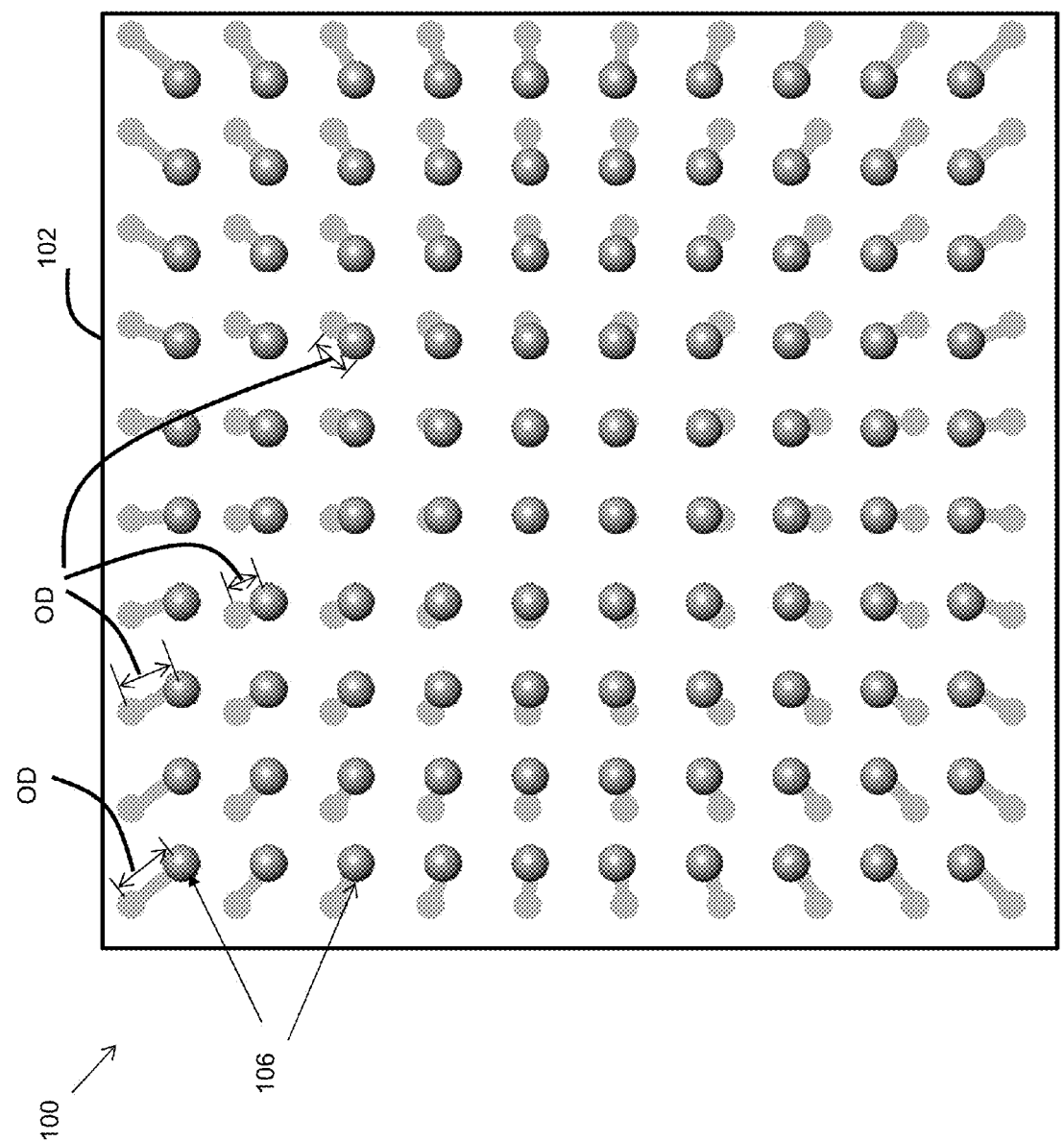
FIG. 1 shows a top view of an RDL in a semiconductor structure according to an embodiment of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

It is known that the orientation of a C4 bump with respect to the final via has an effect on chip-package interaction (CPI) performance. It is also known that the farther in from the chip edge a particular bump is located, the lower the potential impact of laminate shrinkage on the probability of white bump failure, due to CTE mismatch upon chip join cooling. Therefore, it is desirable to laterally offset C4 bumps on an edge of a chip, since the edges of the chip are the most prone to white bump formation and cracking As known in the art, a distance between centers of solder bumps on an IC chip is referred to as a bump pitch. Bump pitch is important because adequate distances must be maintained between solder bumps. Therefore, in order to laterally offset solder bumps proximate to an edge of an IC chip, adjacent solder bumps must also be laterally offset. Embodiments of this invention provide solutions for laterally offsetting solder bumps on an IC chip such that a desired bump pitch is maintained, while solder bumps proximate to an edge of the IC chip are also offset as much as possible. For example, bumps at the edges can be offset as much as a full C4 pitch length, while bumps at the center are not offset at all. Then, all other bumps on the chips are placed to compensate for the fact that there is full offset at the edge and no offset at the center. Embodiments of this invention provide an algorithm to amortize one full offset length in moving from the edge to the center such that the offset for a particular bump would be greater the farther from chip center the particular bump is.

Turning to FIG. 1, in one embodiment, the distance between solder bumps in the final design pattern is variable/non-uniform, and in one embodiment, is controlled by a placement design algorithm, such that the RDL bump wire length (i.e., bump offset) is greatest for bumps at chip edge and corner locations, zero for bumps at the chip center, and proportionately variable at locations between center and edge. In one embodiment, each solder bump on an IC chip is offset laterally toward the interior (center point) of the IC chip by an offset distance that is proportional to the distance between the chip center and the original topmost BEOL connection point, and which is limited by the overall solder bump pitch so as to leave adequate space between itself and its nearest solder bump neighbor.

Figure 2:
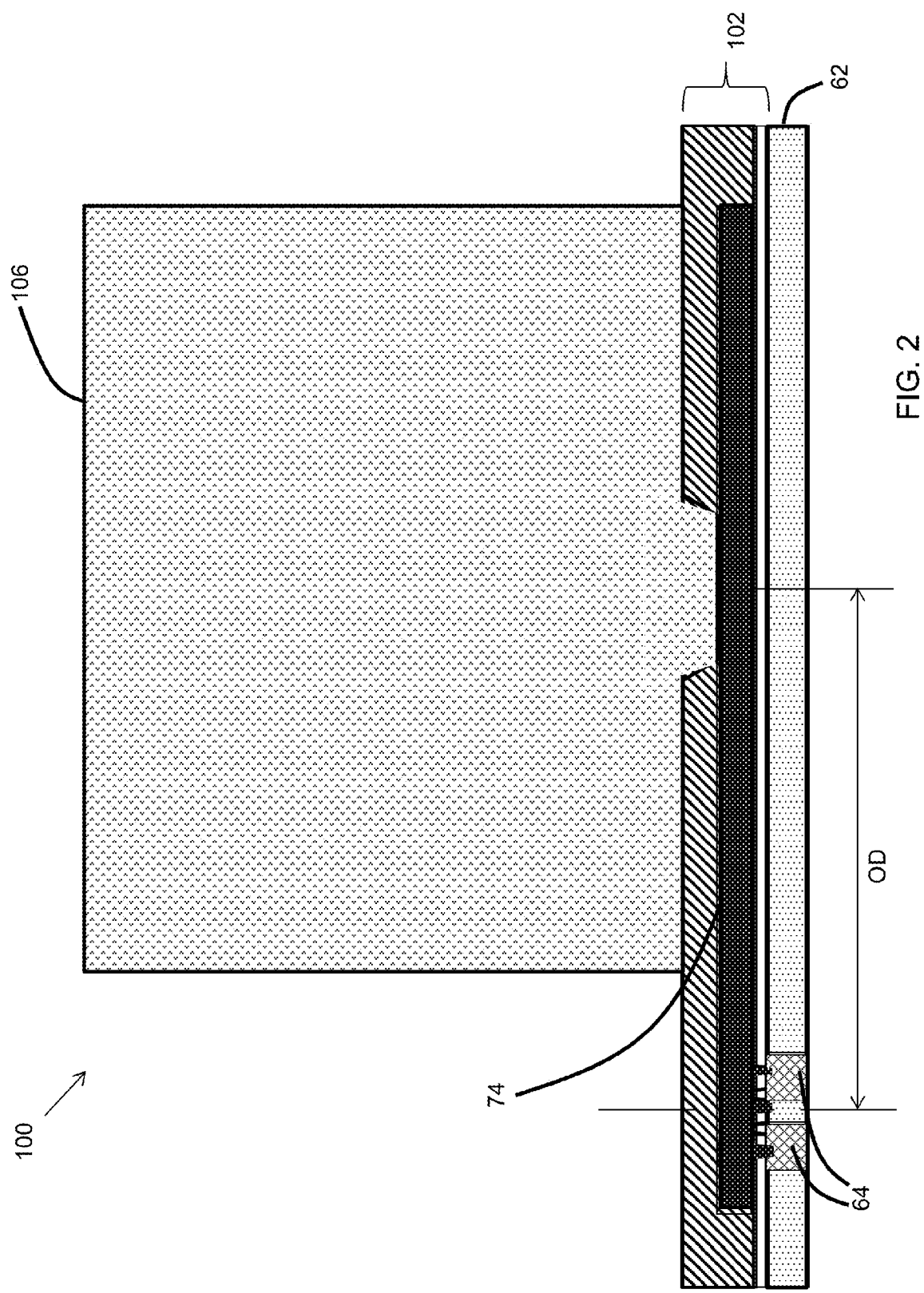
FIG. 2 shows a cross-sectional view of an RDL and offset solder bump according to an embodiment of the invention.

Turning to FIG. 1, a top down view of an integrated circuit (IC) chip 100 including a plurality of C4 solder bumps 106 according to embodiments of the invention is shown. As shown in FIG. 2, each solder bump 106 is connected to a topmost BEOL final/via wire-out point (i.e., metal vias 64) in a topmost BEOL layer 62 by a redistribution layer (RDL) 102 comprised of aluminum or copper. RDL layer 102 acts as a wiring level to create a local interconnect between multiple wiring points. In addition, RDL 102 includes a corresponding pad structure 74 (i.e., bond pad 74) that supports each C4 bump 106 and makes a connection between C4 bump 106 and the wiring level (e.g., metal vertical interconnect accesses (vias) 64) that underlies the bond pad 74 level in a topmost BEOL layer. In other words, each bump 106 is connected to a corresponding bond pad 74, and each bond pad 74 is connected to a corresponding metal via 64 of last BEOL layer 62. Therefore, a connection exists between each bump 106 and its corresponding metal via(s) 64.

Figure 3:
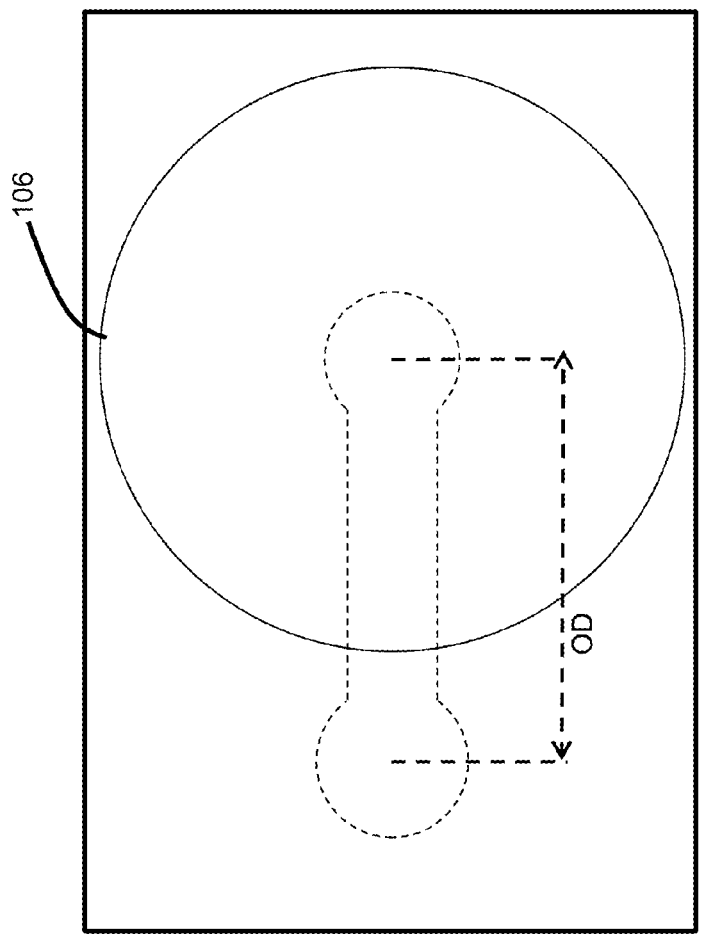
FIG. 3 shows a top view of an RDL and offset solder bump according to an embodiment of the invention.

RDL 102 includes openings exposing metallizations, e.g., metal vias 64, in an active layer of the underlying semiconductor substrate, i.e., last BEOL layer 62. Conventionally, solder bumps are placed on solder bump pad structures such that the solder bumps are directly above a center of its corresponding metal vias 64. However, embodiments of this invention include a solder bump 106 placed on each bond pad 74 such that each solder bump 106 is laterally offset from the center of its corresponding metal vias 64 under its corresponding bond pad 74. As illustrated in FIGS. 1-3, and as discussed in more detail herein, solder bumps 106 are positioned laterally offset towards a center of IC chip 100 from their original topmost BEOL connection point, i.e., a center of metal vias 64, by an offset distance OD.

As can be seen in cross-sectional view in FIG. 2 and top down view in FIG. 3, the offset distance OD is the distance between the original (conventional) connection point for a solder bump, i.e., above metal vias 64, and a center of laterally offset solder bump 106. As such, and as discussed in more detail herein, a longer bond pad 74 is used to connect the laterally offset solder bump 106 to the metallization layers, e.g., metal vias 64, in the BEOL layers. In this way, solder bumps 106 are laterally offset such that at least some of the solder bumps do not overlap metal vias 64 (as discussed herein, bumps 106 proximate the edge of chip 100 are more laterally offset than bumps 106 proximate to the center of chip 100).

As shown in FIG. 1, offset distance OD is variable, i.e., non-uniform, across IC chip 100. In other words, offset distances OD across IC chip 100 are not equivalent. As shown, solder bumps 106 proximate to an edge and a corner of IC chip 100 have an offset distance OD larger than the offset distances OD of solder bumps 106 in an interior of IC chip 100.

In one embodiment, the offset distance OD for a particular solder bump 106 is proportionate to a distance between the center of IC chip 100 and a center of the corresponding bump pad connected to the particular solder bump 106. Calculation of the offset distance OD in this embodiment can be expressed by the following placement algorithm:

$$OD=BP/2*(D_1/D_{max})$$

where OD is the offset distance, BP is a desired bump pitch, $D_1$ is a distance from the chip center to a particular solder bump 106, and $D_{max}$ is a maximum distance from the chip center to the farthest solder bump 106, i.e., a solder bump 106 at a corner of IC chip 100.

In one embodiment, the offset distance OD of a solder bump 106 proximate to an edge of IC chip 100 is approximately half of a desired bump pitch of the solder bumps, while the offset distance OD for a solder bump 106 at the center of IC chip 100 is approximately 0.

Figure 4:
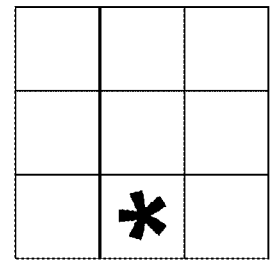
FIG. 4 shows a top view of an IC chip according to an embodiment of the invention.

In another embodiment, the OD distance can be varied by any other variable, for example, varying offset distances according to quadrants of IC chip 100. For example, IC chip 100 can be viewed as having multiple quadrants, for example the nine quadrants shown in FIG. 4. Solder bumps 106 in each quadrant can have the same offset distances, which can be equal or distinct from other quadrants. In one embodiment, quadrants around the outer edge of IC chip 100 can have similar offset distances to each other, but have higher offset distances than a quadrant in the interior of IC chip 100.

In another embodiment, the offset distance OD can be incrementally increased from solder bumps proximate to a center of IC chip 100 to solder bumps 106 proximate to an edge of IC chip 100, using any known formula. For example, offset distances can be increased by a constant factor, or can be increased exponentially or by a varying factor, progressing from an interior to an exterior of the chip.

Systematically offsetting solder bumps 106 according to embodiments of this invention allow solder bumps 106 to be moved away from corners and edges of IC chip 100 while still maintaining the original pattern of solder bumps, and adequate bump pitch between bumps 106.

Turning to FIGS. 5-17, a method for forming RDL layer 102 with a plurality of bond pads 74 having variable offset solder bumps 106 is shown. It is understood that while examples of forming an RDL layer 102 and bond pads 74 are shown, any variation of such layers and forming methods as known in the art can be used.

Figure 5:
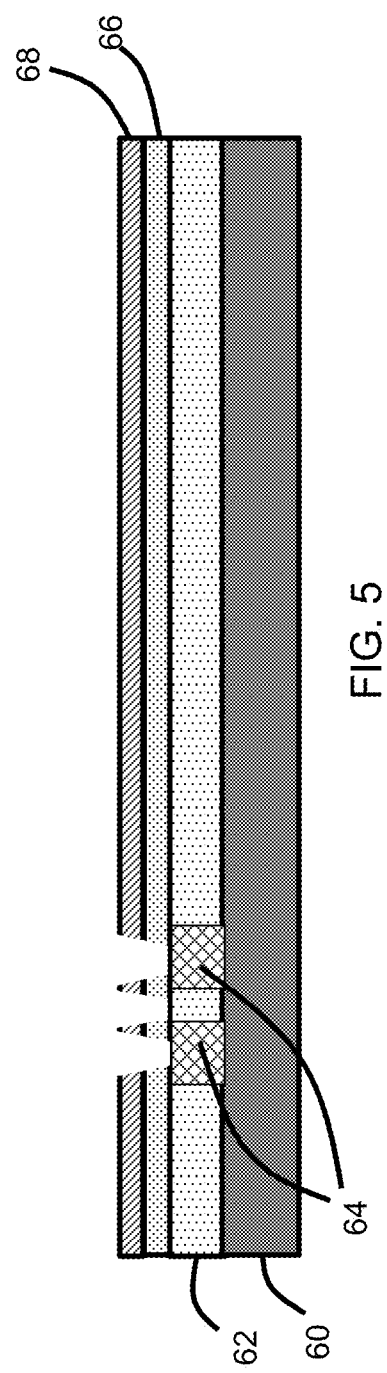
FIGS. 5-17 shows cross-sectional views of a semiconductor chip structure in various stages of a method according to an embodiment of the present invention.

In FIG. 5, a semiconductor substrate 60 is provided, having a last BEOL layer 62 thereon. BEOL layer 62 further includes metallization layers 64, e.g., metal vias 64. Next, a thin copper (Cu) cap 66 is deposited on BEOL layer 62, and then a passivation layer 68, i.e., SiN layer, is deposited over Cu cap 66. As can be seen in FIG. 5, openings are created through Cu cap 66 and passivation layer 68 to expose metal vias 64 in BEOL layer 62.

Figure 6:
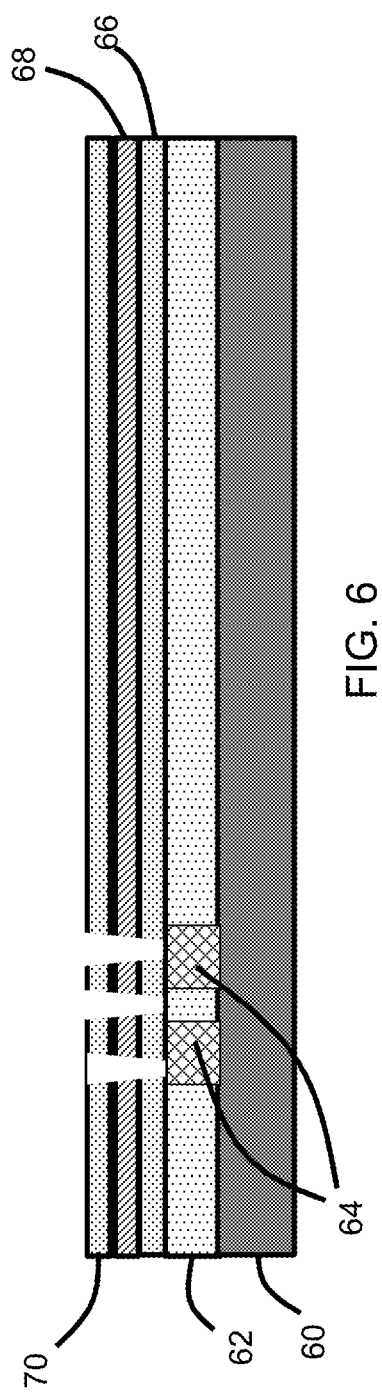
Figure 7:
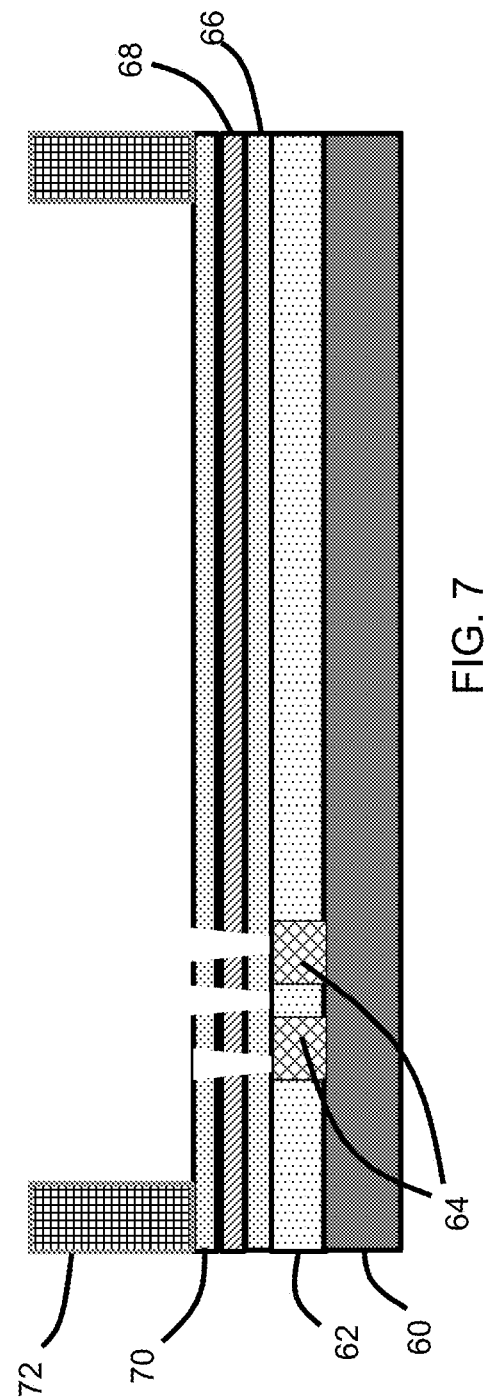
Figure 8:
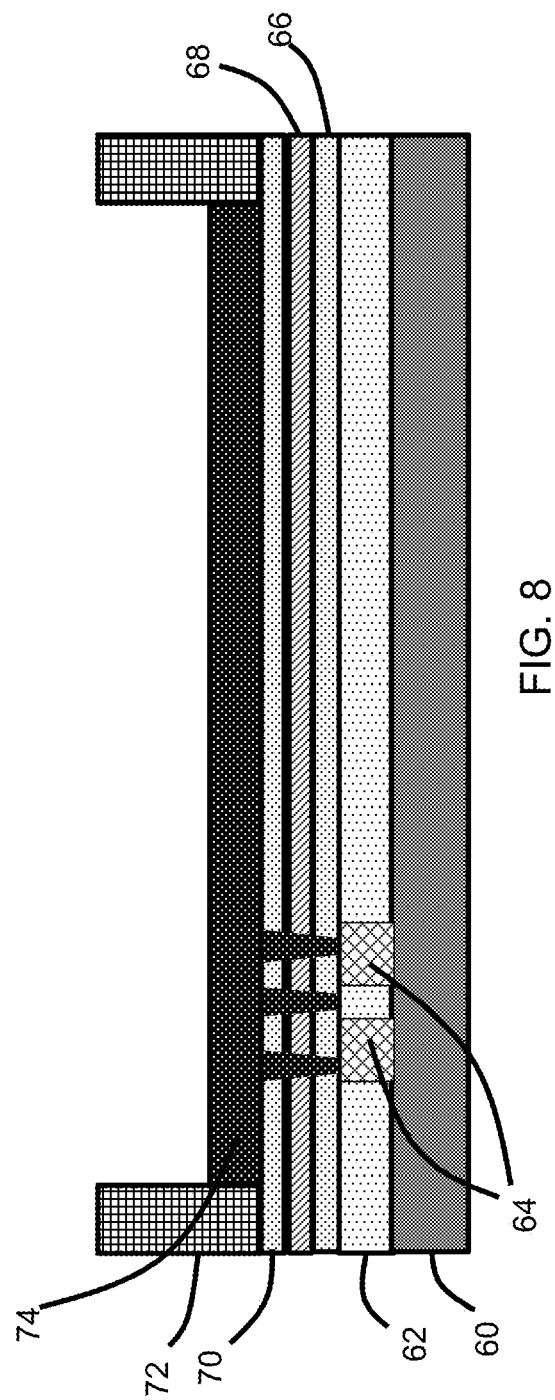
Figure 9:
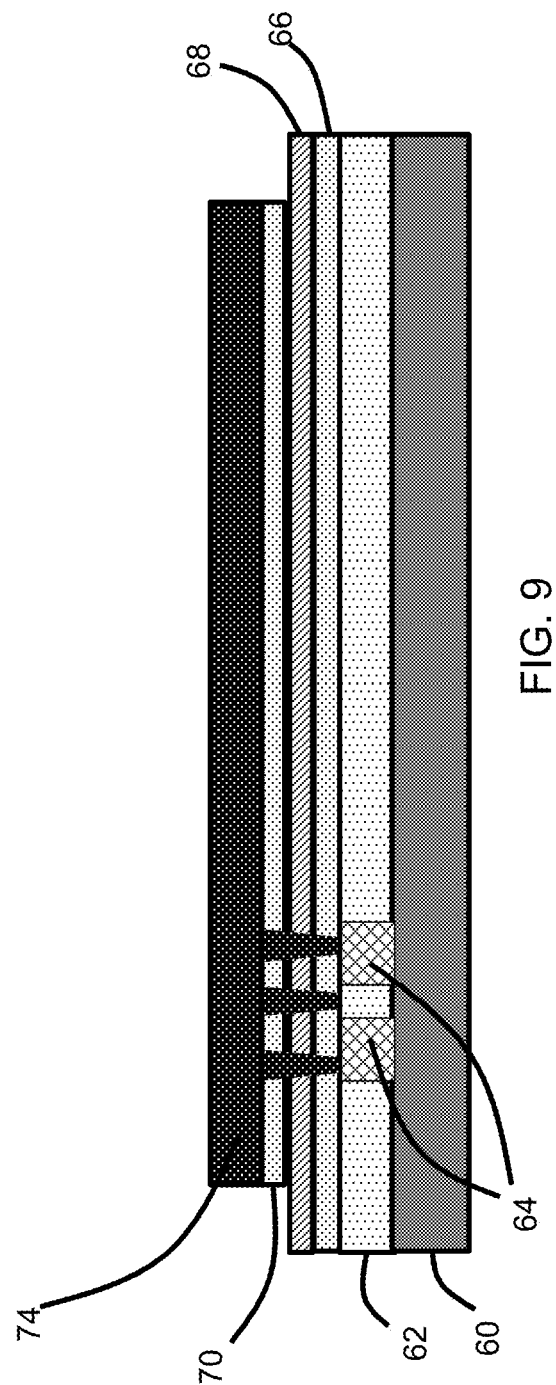

In FIG. 6, a copper seed layer 70 is formed over passivation layer 68, and in FIG. 7, a photoresist layer 72 is added and patterned. In FIG. 8, a copper layer 74 is electroplated, which will act as a lead wire, i.e., bond pad, for a solder bump that will be placed thereon. As shown in FIG. 8, copper layer 74 is configured such that at least a portion of layer 74 contacts at least one metal via 64 of BEOL layer 62. Next, photoresist 72 is stripped and copper seed layer 70 is removed from exposed areas, i.e., except under bond pad 74, as shown in FIG. 9.

Figure 10:
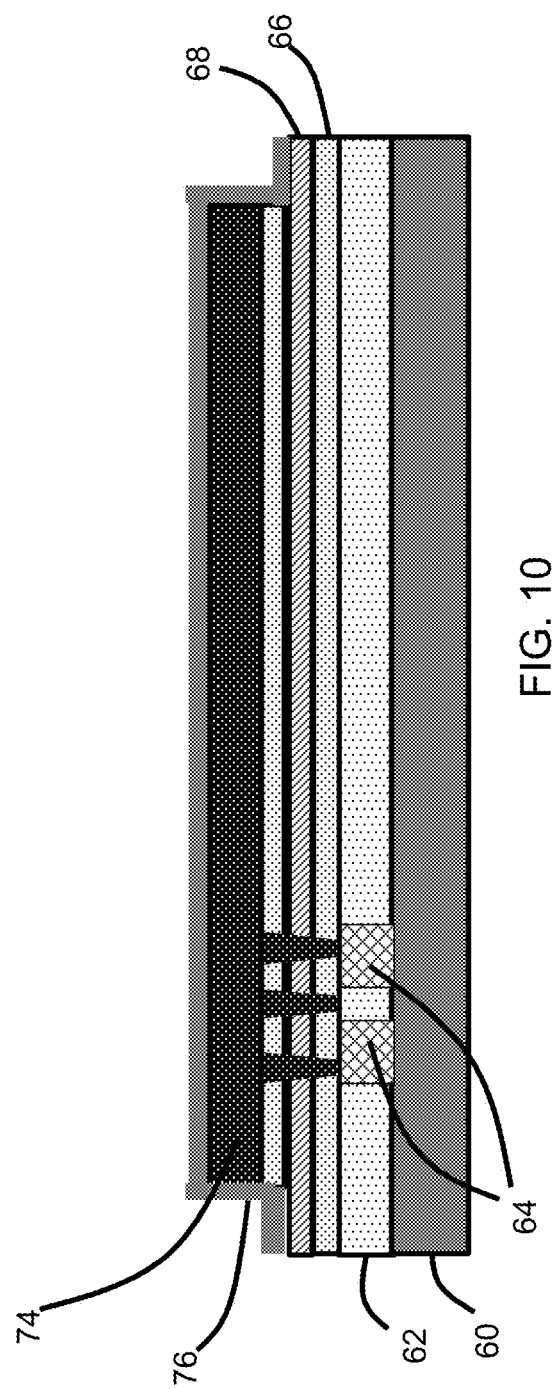
Figure 11:
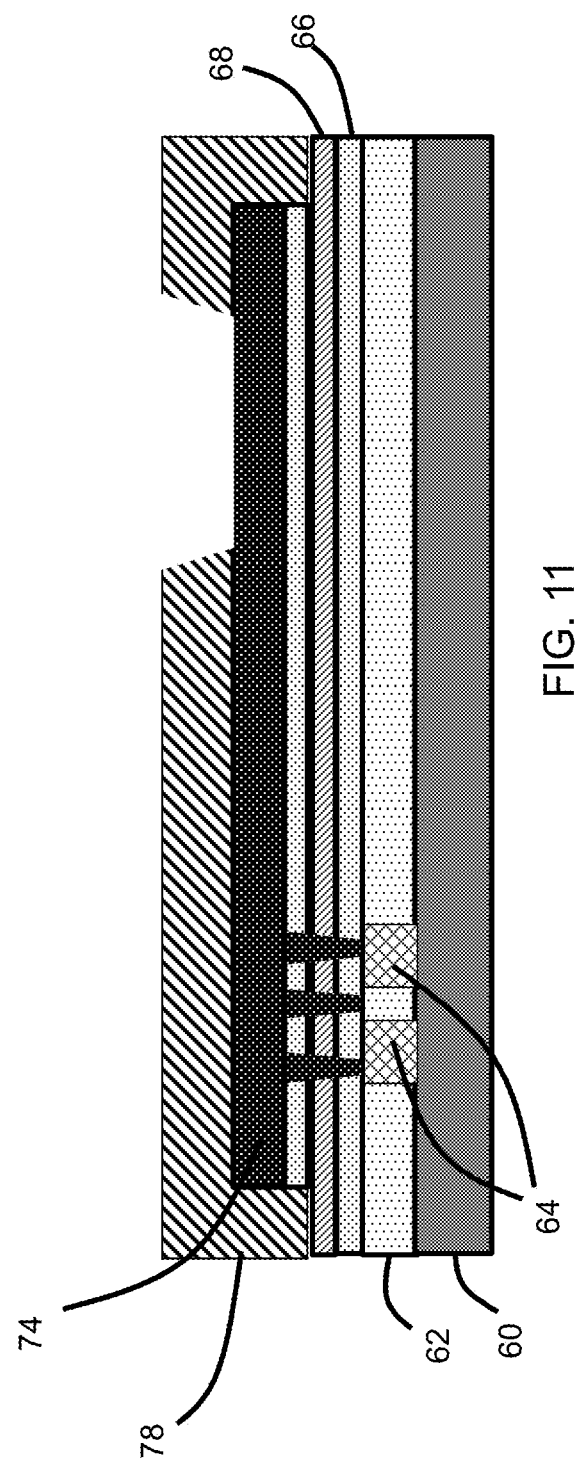
Figure 12:
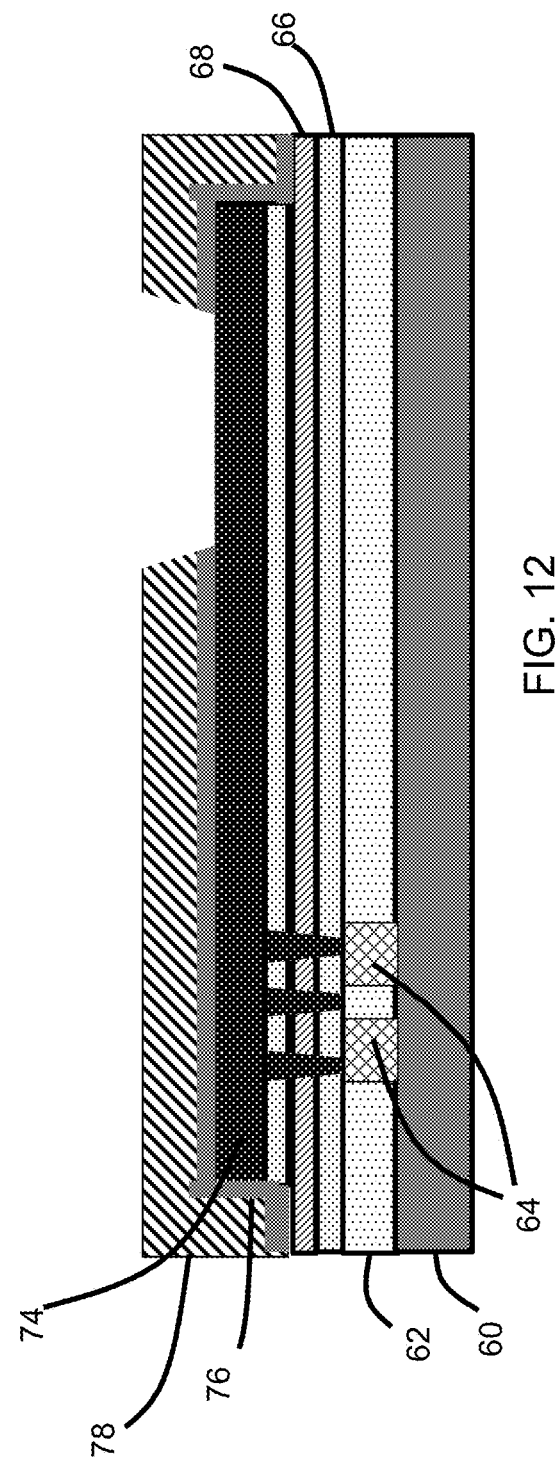

In FIG. 10, an optional SiN passivation layer 76 is deposited. In FIG. 11, a polymeric stress buffer layer 78 is added, patterned, and cured. As shown in FIG. 11, stress buffer layer 78 includes an opening to expose part of copper layer 74. According to embodiments of this invention, copper layer 74 is elongated to allow the opening (which will eventually contact a solder bump) to be displaced from metal vias 64 in the last BEOL layer 62. In contrast to conventional bump pad structures where a solder bump would be placed substantially directly above metal vias 64, thus allowing a shorter copper layer 74, embodiments of this invention include laterally offset solder bumps, requiring a longer copper layer 74 to connect metal vias 64 with a solder bump placed on passivation layer 76 as discussed herein. FIG. 12 shows the same step as FIG. 11, but with the optional SiN layer 76 included.

Figure 13:
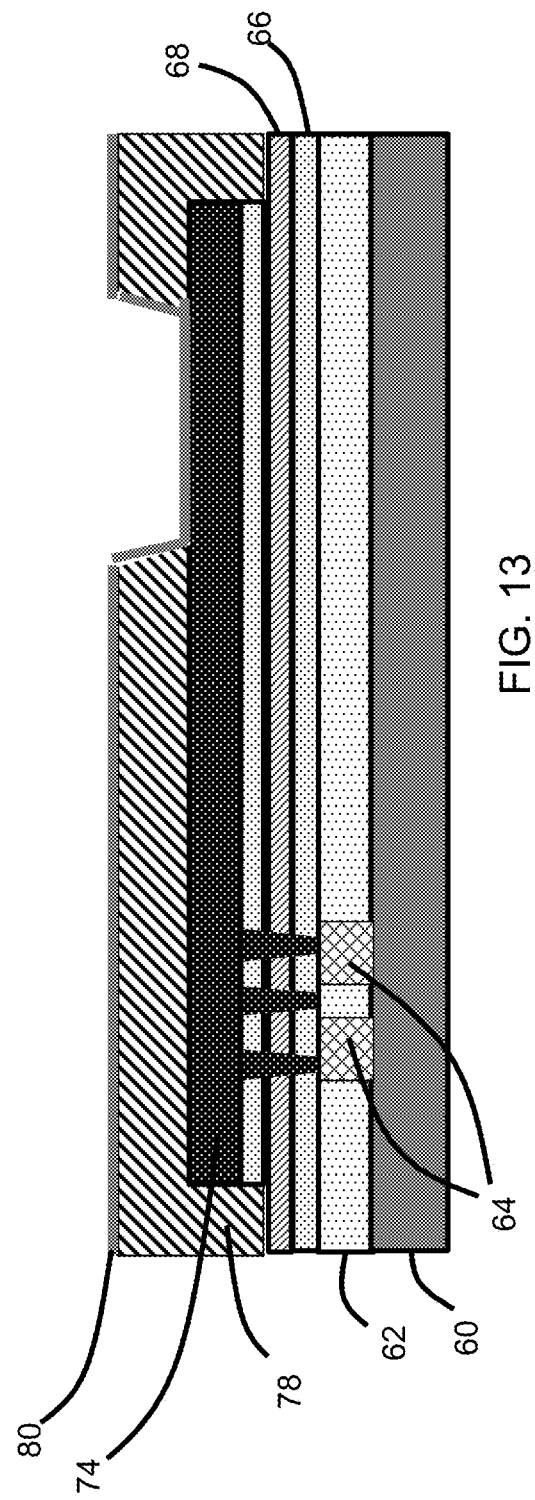
Figure 14:
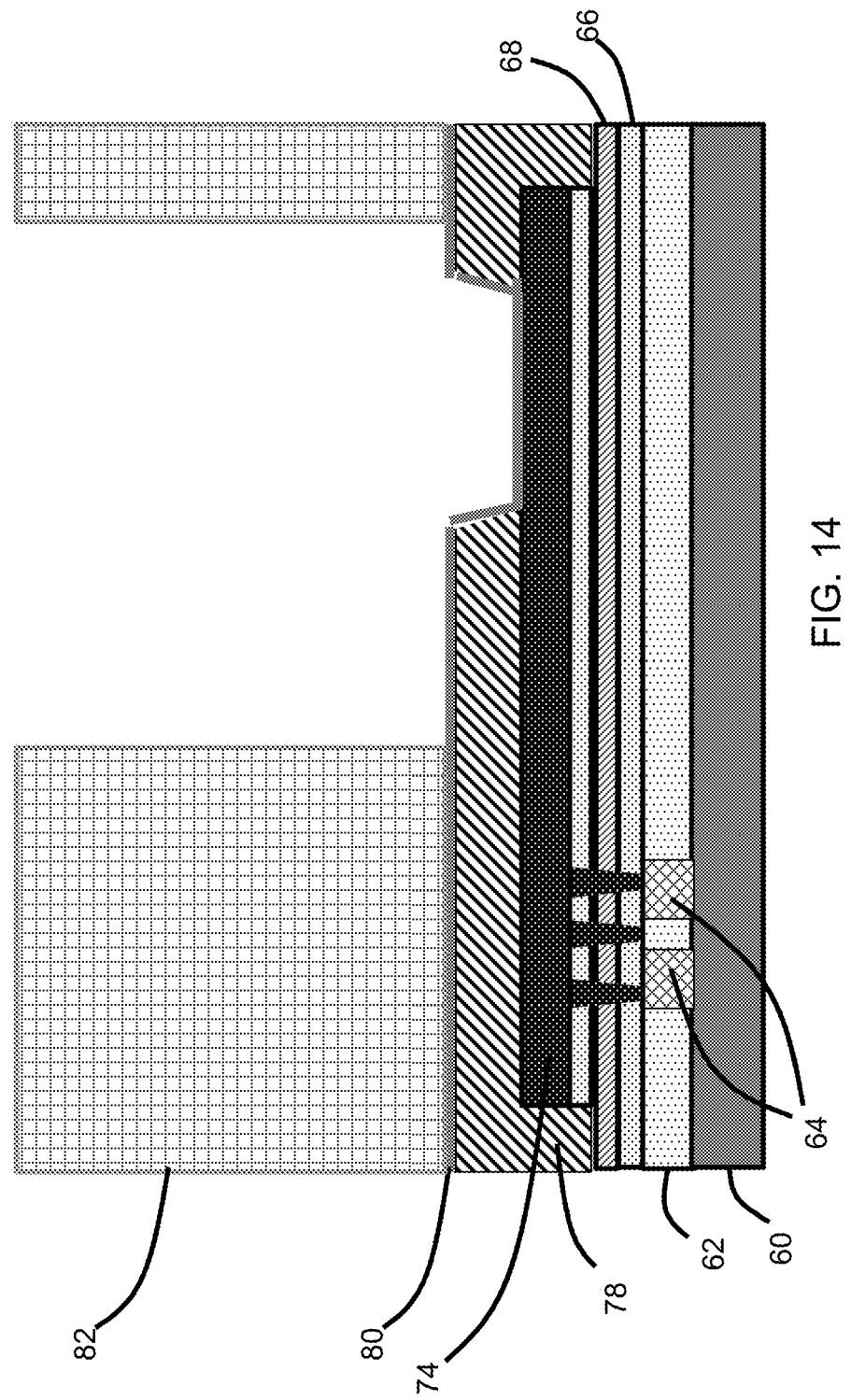
Figure 15:
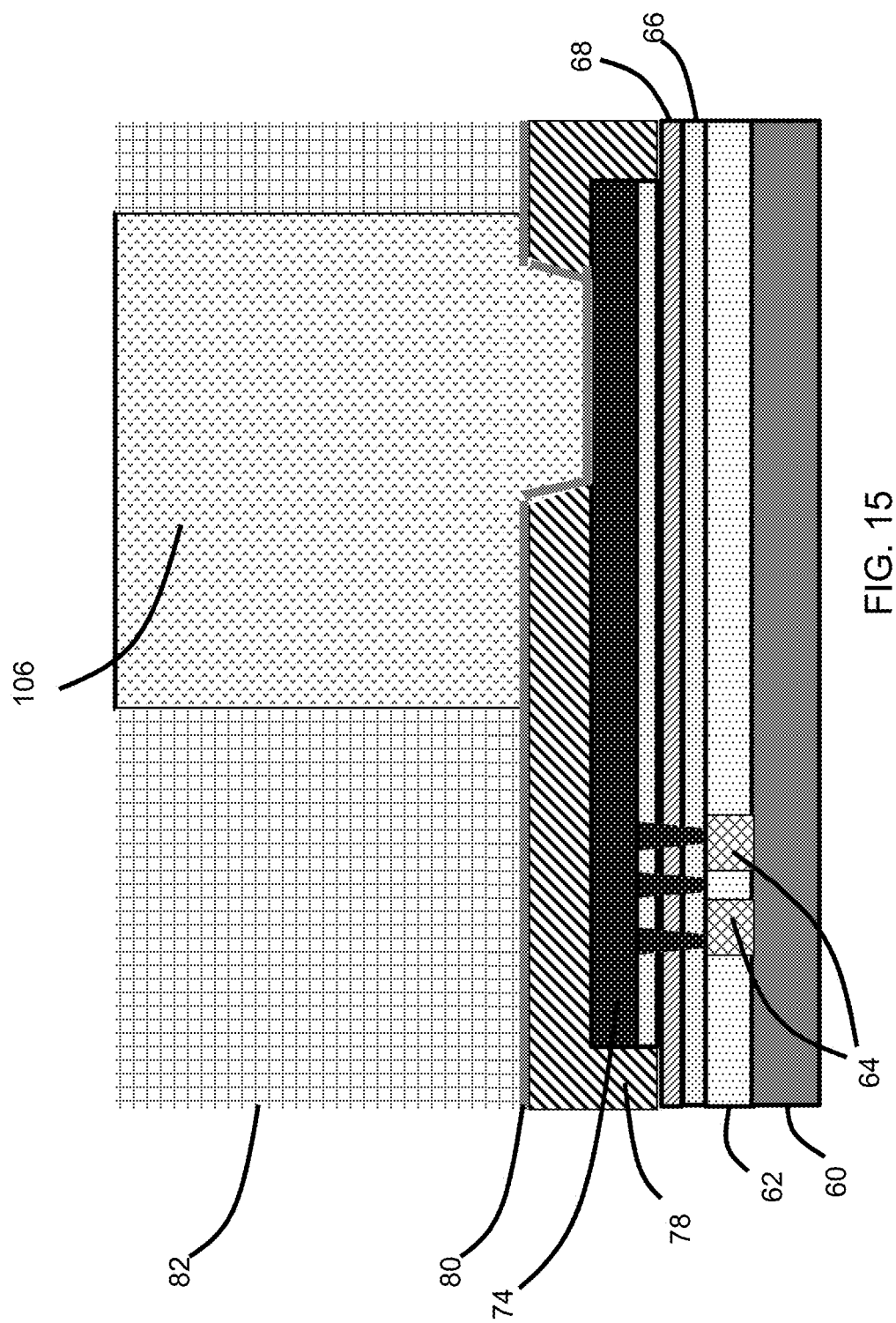

In FIG. 13, a ball limiting metallurgy (BLM) seed layer 80 is added on to polymeric stress buffer layer 76 to define the area where solder bump 106 will be formed. Next, in FIG. 14, photoresist layer 82 is added and patterned to allow solder bump 106 to be plated, as shown in FIG. 15.

Figure 16:
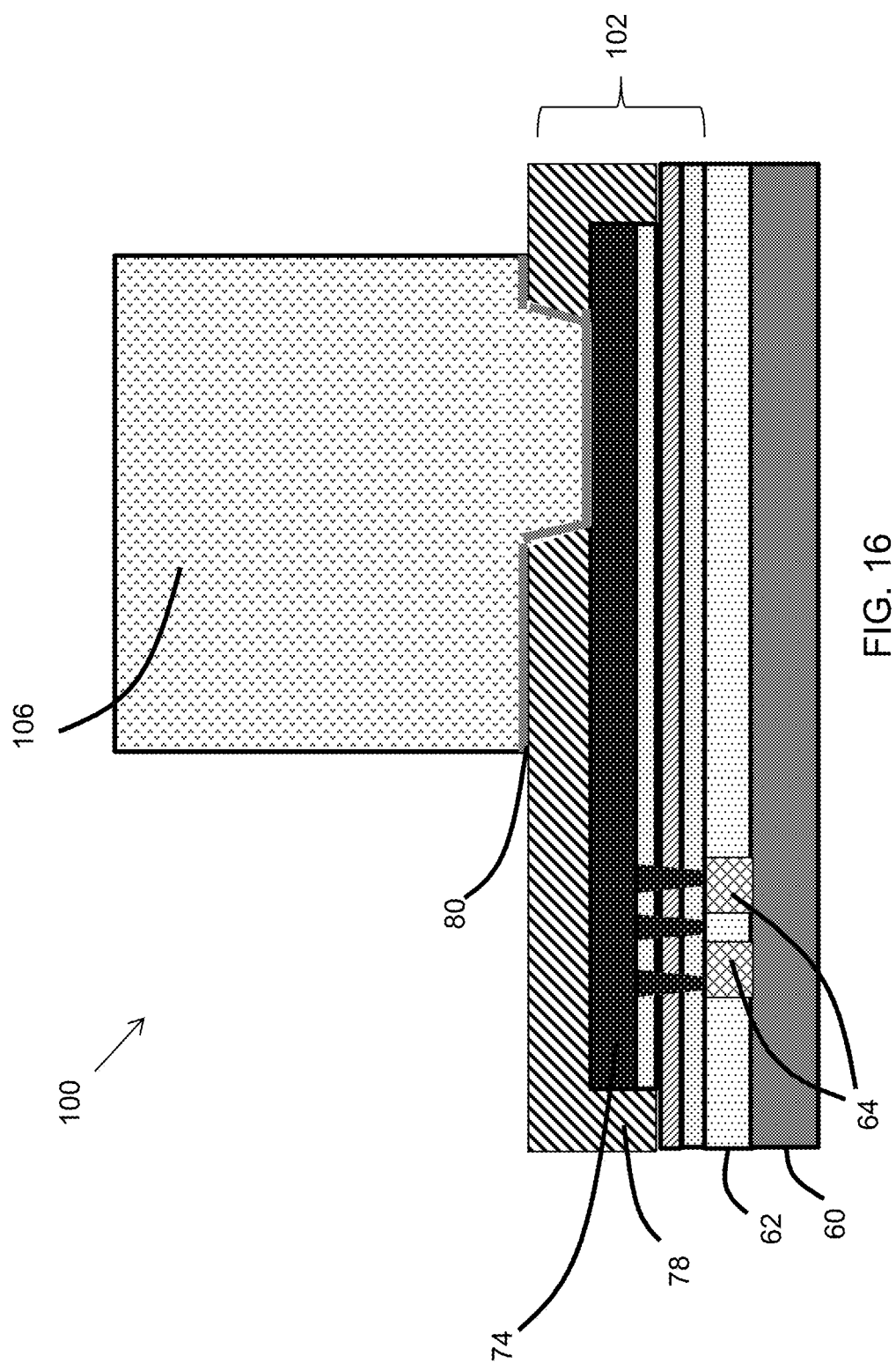
Figure 17:
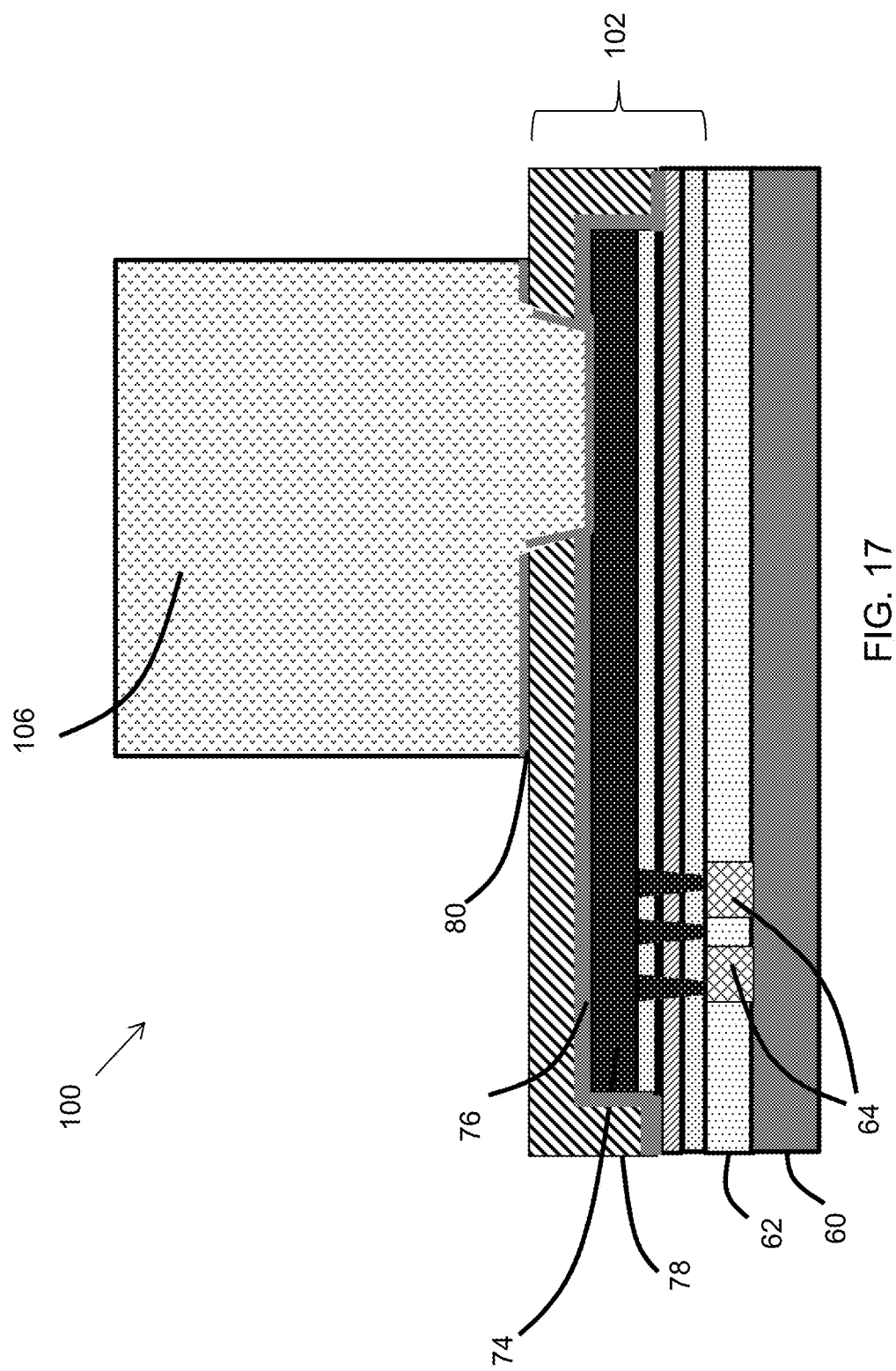

In FIG. 16, photoresist layer 82 is removed, and BLM seed layer 80 can also be removed from field areas using a wet etch process using the C4 structure as a mask. FIGS. 16 and 17 show a final bump pad structure 104 with an offset solder bump 106 according to an embodiment of the invention (note that FIG. 17 shows a similar structure as FIG. 16, but with optional SiN layer 76 included).

As understood in the art, other methods and configurations of bump pad structures 104 and RDL layers 102 can be used in connection with embodiments of this invention. Regardless of the steps used to form RDL layer 102 on IC chip 100, embodiments of this invention include positioning solder bumps 106 on their respective bond pads 74 such that each solder bump 106 is laterally offset towards a center of IC chip 100 by an offset distance OD. As discussed herein, the offset distance OD is variable across IC chip 100 and can be determined using a placement algorithm, or any other known means of determining a variable distance.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. An integrated circuit (IC) chip comprising:
a semiconductor substrate having a plurality of metal vertical interconnect accesses (vias) in a back end of line (BEOL) layer;
a redistribution layer (RDL) on the BEOL layer, the BEOL layer having a plurality of bond pads, each bond pad connected to at least one corresponding metal via through the RDL; and
a solder bump connected to each bond pad, wherein each solder bump is laterally offset from the corresponding metal via connected to the bond pad towards a center of the IC chip by an offset distance, wherein the offset distance is non-uniform across the IC chip, and wherein the offset distance increases from solder bumps proximate to a center of the IC chip to solder bumps proximate to an edge of the IC chip.

2. The IC chip of claim 1, wherein the offset distance incrementally increases from solder bumps proximate to a center of the IC chip to solder bumps proximate to an edge of the IC chip.

3. The IC chip of claim 1, wherein the IC chip has multiple quadrants, and wherein the solder bumps within each quadrant have substantially equal offset distances.

4. The IC chip of claim 3, wherein the offset distance for solder bumps in a quadrant proximate to an edge of the IC chip is larger than the offset distance of solder bumps in a quadrant in an interior of the IC chip.

5. The IC chip of claim 3, wherein the offset distance of solder bumps in a quadrant proximate to an edge of the IC chip is approximately half of a bump pitch of the solder bumps in the quadrant proximate to the edge of the IC chip.

6. The IC chip of claim 1, wherein an offset distance for a solder bump at the center of the IC chip is approximately 0.

7. The IC chip of claim 1, wherein the offset distance for each solder bump is proportionate to a distance between the center of the IC chip and the center of the corresponding metal via for that solder bump.

8. An integrated circuit (IC) chip comprising:
a semiconductor substrate having a plurality of metal vertical interconnect accesses (vias) in a back end of line (BEOL) layer;
a redistribution layer (RDL) on the BEOL layer;
a plurality of bond pads on the RDL, each bond pad connected to a corresponding metal via through the RDL; and
a solder bump connected to each bond pad, wherein each solder bump is laterally offset from the corresponding metal via connected to the bond pad towards a center of the IC chip by an offset distance, wherein the offset distance for each solder bump is proportionate to a distance between the center of the IC chip and the center of the corresponding metal via for that solder bump.

9. The IC chip of claim 8, wherein an offset distance for the solder bump at the center of the IC chip is approximately 0.

10. The IC chip of claim 8, wherein the RDL comprises an aluminum or copper layer.

11. The IC chip of claim 8, wherein the offset distance for solder bumps proximate to an edge of the IC chip is larger than the offset distance of solder bumps in an interior of the IC chip.

12. The IC chip of claim 8, wherein the offset distance for each solder bump is determined by a placement algorithm comprising:

$$OD = BP/2 * (D1/D_{max})$$

where OD is the offset distance, BP is a desired bump pitch for the IC chip, D1 is a distance from the chip center to a particular solder bump, and $D_{max}$ is a maximum distance from the chip center to a solder bump at a corner of the IC chip.

13. The IC chip of claim 8, wherein the offset distance of a solder bump proximate to an edge of the IC chip is approximately half of a desired bump pitch of the solder bumps on the IC chip.

14. A method for non-uniformly offsetting solder bumps on an integrated circuit (IC) chip, the method comprising:
providing a semiconductor substrate having a plurality of metal vertical interconnect accesses (vias) in a back end of line (BEOL) layer;
forming a redistribution layer (RDL) on the BEOL layer;
forming a plurality of bond pads on the RDL, each bond pad connected to a corresponding metal via through the RDL; and
positioning a solder bump on each solder bump pad structure such that each solder bump is laterally offset from the corresponding metal via connected to the bond pad towards a center of the IC chip by an offset distance, wherein the offset distance is non-uniform across the IC chip, and wherein the offset distance for solder bumps proximate to an edge of the IC chip is larger than the offset distance of solder bumps in an interior of the IC chip.

15. The method of claim 14, wherein the offset distance for each solder bump is proportionate to a distance between the center of the IC chip and the center of the corresponding metal via for that solder bump.

16. The method of claim 14, wherein an offset distance for a solder bump at the center of the IC chip is approximately 0.

17. The method of claim 14, wherein the positioning includes using a placement algorithm to determine the offset distance for each solder bump, wherein the placement algorithm comprises:

$$OD = BP/2 * (D1/D_{max})$$

where OD is the offset distance, BP is a desired bump pitch for the IC chip, D1 is a distance from the chip center to a particular solder bump, and $D_{max}$ is a maximum distance from the chip center to a solder bump at a corner of the IC chip.

18. The method of claim 14, wherein the offset distance of a solder bump proximate to an edge of the IC chip is approximately half of a desired bump pitch of the solder bumps on the IC chip.

19. The method of claim 14, wherein the positioning includes incrementally increasing an offset distance from solder bumps proximate to a center of the IC chip to solder bumps proximate to an edge of the IC chip.

* * * * *